United States Patent
Miwa et al.

(10) Patent No.: US 8,043,772 B2
(45) Date of Patent: Oct. 25, 2011

(54) MANUFACTURING METHOD AND MANUFACTURING SYSTEM OF SEMICONDUCTOR DEVICE

(75) Inventors: Toshiharu Miwa, Yokohama (JP);
Junko Konishi, Yokohama (JP);
Toshihide Kawachi, Hitachinaka (JP);
Shigenori Yamashita, Itami (JP);
Takeshi Tashiro, Hitachinaka (JP);
Hidekimi Fudo, Hitachinaka (JP)

(73) Assignee: Renesas Electronics Corporation, Kanagawa (JP)

( * ) Notice: Subject to any disclaimer, the term of this patent is extended or adjusted under 35 U.S.C. 154(b) by 273 days.

(21) Appl. No.: 12/466,695

(22) Filed: May 15, 2009

(65) Prior Publication Data
US 2009/0286174 A1    Nov. 19, 2009

(30) Foreign Application Priority Data
May 16, 2008    (JP) .................................. 2008-129120

(51) Int. Cl.
*G03F 9/00*    (2006.01)
(52) U.S. Cl. ............ 430/30; 430/22; 382/144; 382/148; 382/149; 382/151
(58) Field of Classification Search ................... 430/22, 430/30; 382/145, 148, 149, 151
See application file for complete search history.

(56) References Cited

FOREIGN PATENT DOCUMENTS

| JP | 2002-190443 A | 7/2002 |
|---|---|---|
| JP | 2002-353104 A | 12/2002 |
| JP | 2003-257838 A | 9/2003 |
| JP | 2004-281557 A | 10/2004 |
| JP | 2005-109016 A | 4/2005 |
| JP | 200-30466 A | 2/2006 |
| JP | 2006-128572 A | 5/2006 |
| JP | 2007-115784 A | 5/2007 |

*Primary Examiner* — Christopher Young
(74) *Attorney, Agent, or Firm* — Mattingly & Malur, PC

(57) ABSTRACT

In an exposure process forming a predetermined circuit pattern of a semiconductor device on a wafer, a resist dimension of the resist pattern formed on a wafer and a focus position in the exposure process at a past time are measured. A resist dimension and a focus position of a wafer to which the exposure process is secondly performed are estimated by using measurement results of the measured resist dimension and focus position, and a focus offset value is calculated by using estimated values of the estimated resist dimension and focus position. Then, an exposure dose is calculated with considering this focus offset value, and a resist pattern is formed on the wafer to which the exposure process is performed by using the calculated exposure dose and focus offset value.

5 Claims, 14 Drawing Sheets

FIG. 13

| PRODUCT NAME | AAA |
|---|---|
| EXPOSURE PROCESS | BBB |
| EXPOSURE DEVICE | #01 |
| MASK NUMBER | CCC |
| LOT NUMBER | DDD |
| WAFER NUMBER | 1 |
| EXPOSURE DOSE | 10 |
| FOCUS OFFSET VALUE | 0.01 |

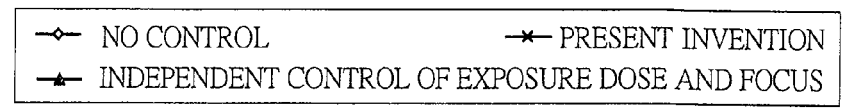
FIG. 14A
CONTROL RESULT OF RESIST DIMENSION
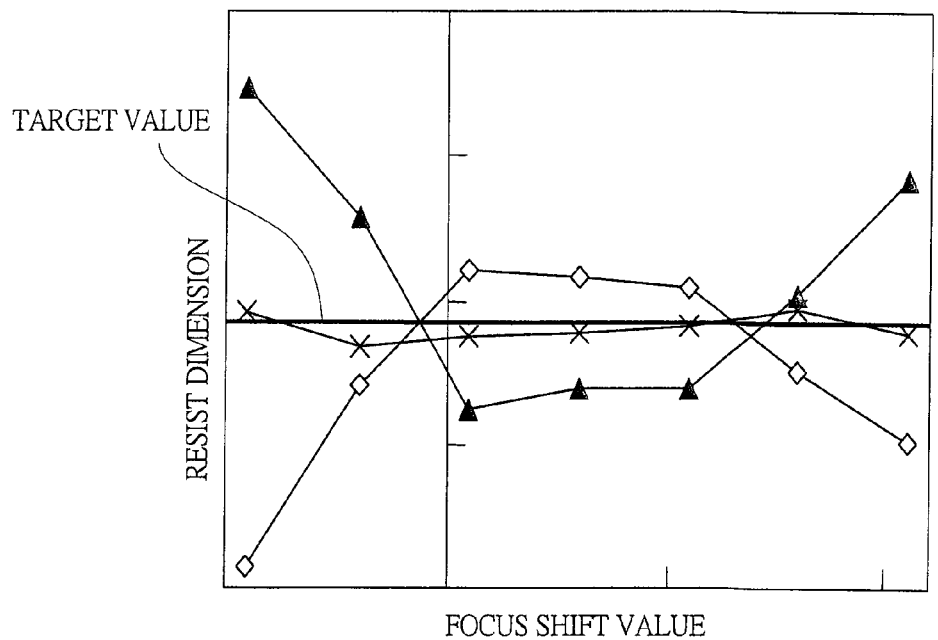
FIG. 14B
CONTROL RESULT OF RESIST SIDEWALL ANGLE
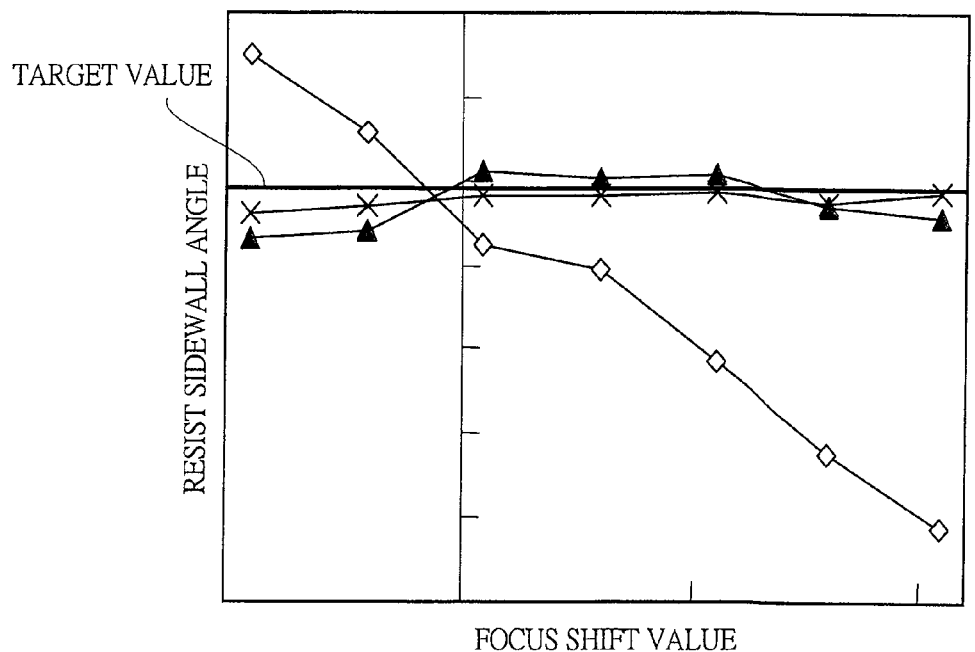

_US 8,043,772 B2_

MANUFACTURING METHOD AND MANUFACTURING SYSTEM OF SEMICONDUCTOR DEVICE

CROSS-REFERENCE TO RELATED APPLICATION

The present application claims priority from Japanese Patent Application No. JP 2008-129120 filed on May 16, 2008, the content of which is hereby incorporated by reference into this application.

TECHNICAL FIELD OF THE INVENTION

The present invention relates to the manufacturing technique of a semiconductor device. More particularly, the present invention relates to a technique effectively applied to a manufacturing method and a manufacturing system having an exposure process for forming a circuit pattern on the semiconductor device.

BACKGROUND OF THE INVENTION

According to the studies carried out by the present inventors with respect to the manufacturing technique of the semiconductor device, since a degree of integration and a performance of the semiconductor device are enhanced by a proportional reduction of a device dimension, for example, in the manufacture of the semiconductor device, a microfabrication of the device dimension has been advanced year by year. In the advancement of such a microfabrication process technique, it has been increasingly important to reduce a variation of the dimension of the circuit pattern formed on the substrate wafer for stability of electric performance of the semiconductor device. More particularly, since a variation of a gate dimension of a transistor causes a variation of a threshold voltage of the transistor, the variation of the gate dimension of the transistor is required to be severely managed.

As described above, under circumstances where a reduction of the dimensional variation of the circuit pattern formed on the substrate wafer becomes important, techniques and the like disclosed in, for example, Patent Documents 1 to 4 are proposed with respect to the manufacturing technique having the exposure process forming the circuit pattern on the semiconductor device.

In Patent Document 1, different resist patterns are formed in a region having differences in height on the substrate wafer for measuring a focus shift amount with high accuracy in the exposure processing, and a shift amount of a focus position is measured from a difference between these resist dimensions (CD).

In Patent Document 2, by utilizing phenomenon in which the changes of the resist dimensions are different when the exposure dose and the focus condition change depending on a pattern density, two types of resist shapes for the focus measurement which are different in the pattern density are formed on the substrate wafer to measure the shift amount of the focus position by its measurement result of each of the resist dimensions.

In Patent Document 3, the resist dimension of the wafer to which the exposure processing is performed with previously changing the focus condition is measured by scatterometry to determine the optimum focus position from its measurement result, and then, to transmit a focus offset value to exposure device, thereby controlling the focus position.

In Patent Document 4, information related to a wafer is measured and is written in an IC tag attached on the wafer, and then, the information related to the wafer is read from the IC tag in the exposure processing, and the exposure processing is performed based on this read information.

[Patent Document 1] Japanese Patent Application Laid-open Publication No. 2006-30466
[Patent Document 2] Japanese Patent Application Laid-open Publication No. 2005-109016
[Patent Document 3] Japanese Patent Application Laid-open Publication No. 2006-128572
[Patent Document 4] Japanese Patent Application Laid-open Publication No. 2007-115784

SUMMARY OF THE INVENTION

As a result of studies by the present inventors with respect to the manufacturing technique having the exposure process forming the circuit pattern on the semiconductor device in the manufacturing technique of the semiconductor device as described above, the following is apparent.

For example, in the manufacturing technique of the semiconductor device, a required accuracy of the dimensional variation of the circuit pattern formed on the substrate wafer becomes low accompanied with the microfabrication of the semiconductor device. In the exposure processing which forms the resist pattern, shortening of a wavelength of an exposure light source and realizing of high NA (Numerical Aperture) of a projection lens are promoted to enhance a resolution of the pattern accompanied with the microfabrication. On the other hand, by shortening of the wavelength of the exposure light source and realizing of high NA of the projection lens, a focal depth of a transferred pattern in the exposure processing becomes shallow. Therefore, accompanied with the microfabrication of the pattern dimension, the management of not only the resist dimension but also the focus position (focus) is required in the exposure processing.

In Patent Document 1 and Patent Document 2, a plurality of resist patterns for the focus measurement are formed on the substrate wafer, and then, the focus position in the exposure processing is measured from its measurement result of these resist dimensions. In these methods, since an exclusive pattern differing from the resist pattern having the managed focus position is used, a result of the focus measurement does not always show a focus position in a resist pattern to be a target.

Further, in Patent Document 3, the wafer to which the exposure processing is performed with previously changing the focus position is prepared to measure the resist dimension for the focus position change, thereby determining the optimum focus position. The wafer to which the exposure processing is performed with changing the focus condition cannot be used as an actual product, and therefore, it is not possible to measure the shift of the focus position in the exposure processing of the actual product.

Still further, in Patent Document 4, information related to the wafer is measured and is written in the IC tag attached on the wafer. There is information of the focus offset, information of the exposure dose offset, and the like as the information to be written. However, such an algorithm is not clear yet how this information can be determined from its measured value as the information of the exposure processing.

Hence, in the exposure processing of the manufacture of a semiconductor device, an object of the present invention is to provide a manufacturing method and a manufacturing system of the semiconductor device capable of measuring the resist dimension and the focus position of the resist shape transferred on the wafer of the actual product for correcting the shifts of the resist dimension and the focus position in the exposure processing, and sequentially adjusting control parameters of the exposure device in order of the focus offset value and the exposure dose by using its measurement result, thereby reducing the variations of the dimension of resist and the shape thereof due to the exposure process shift without previously performing an inspection work.

The above and other objects and novel characteristics of the present invention will be apparent from the description of the present specification and the accompanying drawings.

The typical ones of the inventions disclosed in the present application will be briefly described as follows.

That is, the typical ones are applied to a manufacturing method and a manufacturing system of a semiconductor device. And, in an exposure process forming a predetermined circuit pattern of the semiconductor device on a wafer, the typical ones are to measure a resist dimension of the past resist pattern formed on the wafer and a focus position in the exposure processing, and then, by using its measurement result of the resist dimension and the focus position, to evaluate a resist dimension on a wafer to which the exposure processing is performed and a focus position thereof. And, by using its evaluated values of the resist dimension and the focus position, a focus offset value is calculated, and then, an exposure dose is calculated considering the focus offset value, thereby forming a resist pattern on a wafer to which the exposure processing is performed by using the calculated exposure dose and focus offset value.

A specific manufacturing system of the semiconductor device is configured with: a first database for storing measurement results of a resist shape (dimension, height, cross-sectional shape, and the like) in the exposure processing of the manufacture of the semiconductor device and a focus position in the exposure processing; a second database for registering exposure conditions (exposure dose, focus offset value, and the like) set up at the exposure processing; a third database for storing manufacturing specifications (target values of the resist shape and the focus position, and the like) in each of the processes of the manufacture of the semiconductor device; a fourth database for registering a control model equation of the resist dimension and the focus position; and an exposure condition control process unit for calculating the shift amounts of the resist dimension and the focus position of a corresponding wafer to which the exposure processing is performed by using a measurement history of the past resist dimension and focus position, and calculating the exposure dose and the focus offset value of the corresponding wafer to which the exposure processing is performed by using the shift amounts of the resist dimension and the focus position of the corresponding wafer to which the exposure processing is performed and the control model equation of the resist dimension and focus position so as to match the resist dimension and the focus position of the corresponding wafer to which the exposure processing is performed with a target value.

Each process step in the exposure condition control process unit configuring the manufacturing system of the semiconductor device includes:

(1) a step for acquiring a measurement result of the resist dimension and the focus position of the past wafer corresponding to the type, the process, and the exposure device for the semiconductor device of the wafer to which the exposure processing is performed;

(2) a step for calculating shift values of the resist dimension and the focus of the wafer to which the exposure processing is performed by using the measurement results acquired at the step (1);

(3) a step for acquiring target values of the resist dimension and the focus position corresponding to the type and the process of the semiconductor device of the wafer to which the exposure processing is performed;

(4) a step for acquiring control model equations of the resist dimension and the focus position corresponding to the type, the process, and the exposure device of the semiconductor device of the wafer to which the exposure processing is performed;

(5) a step for calculating the focus offset value of the wafer to which the exposure processing is performed by using the focus shift value calculated at the step (2) of the wafer to which the exposure processing is performed, the target value acquired at the step (3), and the control model equation acquired at the step (4);

(6) a step for calculating a changed value of the resist dimension by the focus offset value calculated at the step (5); and (7) a step for calculating the exposure dose of the wafer to which the exposure processing is performed by using shift values of the resist dimension and the focus calculated at the step (2) of the wafer to which the exposure processing is performed, the changed value of the resist dimension calculated at the step (6), the target value acquired at the step (3), and the control model equation acquired at the step (4). And, a control process of the exposure condition is performed by sequentially performing from the step (1) to the step (7), and the exposure processing is performed by using the exposure condition.

The effects obtained by typical aspects of the present invention will be briefly described below.

That is, the effects obtained by typical aspects are, for stabilizing the resist dimension and shape in the exposure processing of the manufacture of the semiconductor device, to measure the resist dimension and the focus position of the resist shape transferred on the wafer of the actual product, and to adjust sequentially control parameters of the exposure device in order of the focus offset value and the exposure dose by using its measurement results, thereby being capable of reducing the variations of the dimension of resist and the shape thereof due to the exposure process shift without previously performing an inspection work. And, as a result, the operation performance of the semiconductor device is improved, and moreover, an operating rate of the exposure device can be improved.

BRIEF DESCRIPTION OF THE DRAWINGS

FIG. 13 is a diagram showing one example of an output screen for performing an instruction of exposure conditions in the first embodiment of the present invention;

FIG. 14A is a diagram showing a control result of the exposure dose and the focus offset value when the focus shift occurs in each of the embodiments of the present invention and shows a change of the resist dimension for the focus shift value;

FIG. 14B is a diagram showing a control result of the exposure dose and the focus offset value when the focus shift occurs in each of the embodiments of the present invention and shows a change of a resist sidewall angle for the focus shift value.

DESCRIPTION OF THE PREFERRED EMBODIMENTS

Hereinafter, embodiments of the present invention will be described in detail with reference to the accompanying drawings. Note that components having the same function are denoted by the same reference symbols throughout the drawings for describing the embodiments, and the repetitive description thereof will be omitted.

In the following description, first, an outline of embodiments applied to the manufacturing technique of a semiconductor device such as the present invention will be described, and next, contents of each embodiment showing characteristics of the present invention will be specifically described.

(Outline of Embodiments)

Figure 2:
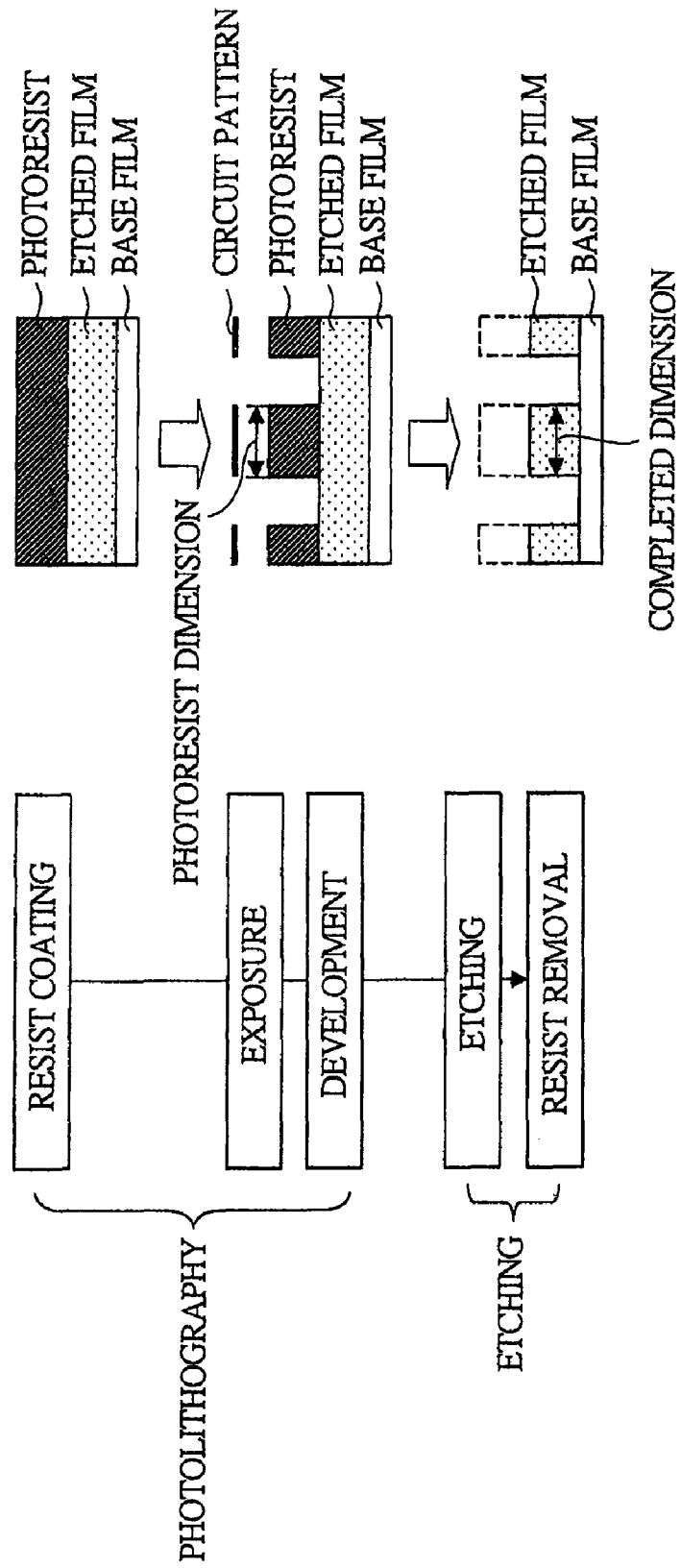
FIG. 2 is a diagram showing a method for transferring a pattern in a manufacture of the semiconductor device in an outline of the one embodiment of the present invention.

FIG. 2 is a diagram showing a method for transferring a pattern in the manufacture of the semiconductor device, and shows a method for forming a circuit pattern to an etched film on a substrate wafer.

First, the circuit pattern is transferred to a photoresist (hereinafter, referred to as resist) film which is a photosensitive resin on the wafer in a photolithography process. At this time, first, the resist film is coated on the wafer (resist coating processing). Next, an optical image of the circuit pattern is transferred to the resist film by using an exposure device (exposure processing). After that, the resist pattern is formed by a developing process. In an etching process, the circuit pattern is formed on an etched film on the wafer using the resist pattern formed in the photolithography process as a mask. Further, when the etched film is a multilayer, the etching processing may be performed divided into a plurality of times. At that time, not only the resist pattern but also the etched film etched previously may be used as the mask in the next etching process. As shown in the figure, causes of a dimensional variation of the transferred pattern are largely categorized into the photolithography process and the etching process. A dimensional management of the transferred pattern is performed in each of the photolithography process and the etching process.

Figure 3:
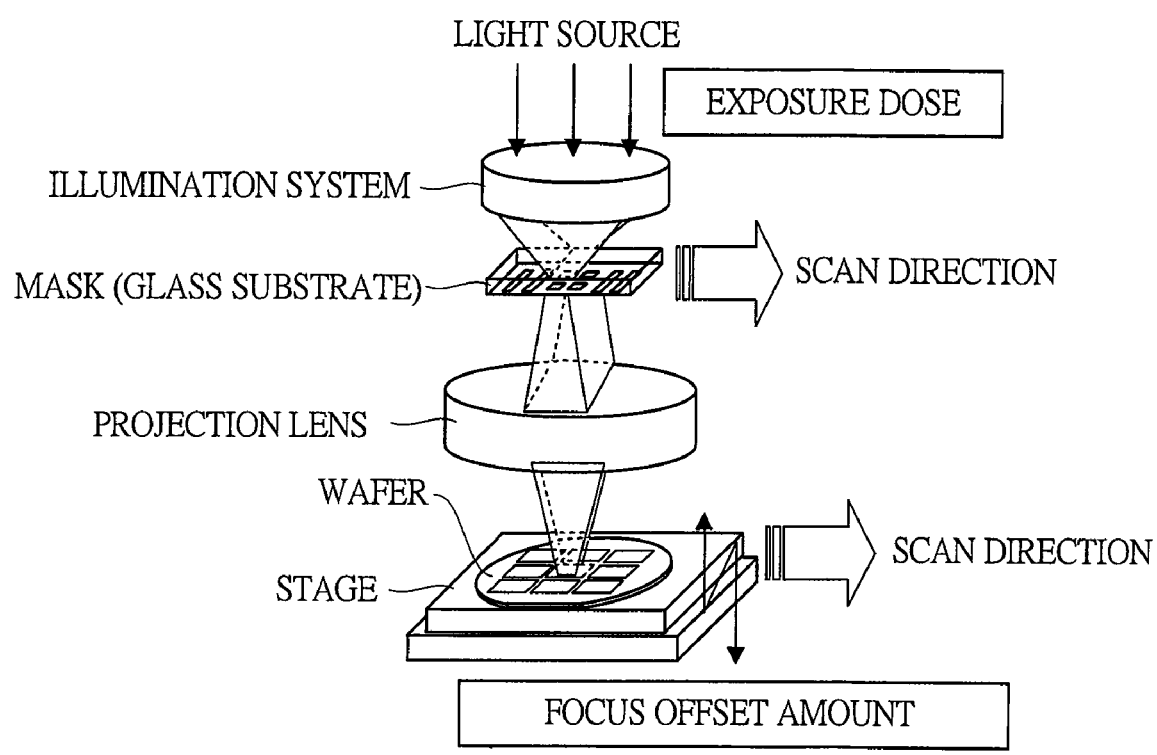
FIG. 3 is a diagram showing a configuration of a step and repeat projection exposure system in the outline of the one embodiment of the present invention.

FIG. 3 is a diagram showing a configuration of a step and repeat projection exposure system, and shows a configuration of a step and repeat projection exposure system (scanner) of a lens scanning system used in the exposure processing of the photolithography process.

In the exposure device, an incident light irradiated through an illumination system from a light source is diffracted by the circuit pattern drawn on a glass substrate (called a mask) and is passed through a projection lens, so that the incident light is projected to the resist film on the wafer In the lens scanning system, the incident light is not irradiated to an entire surface of the mask at once but only to a slit portion having a certain width in the mask. At the exposure processing, the slit portion on the mask is scanned in synchronization with a wafer stage, thereby performing the exposure processing of the entire surface of the mask.

Figure 4:
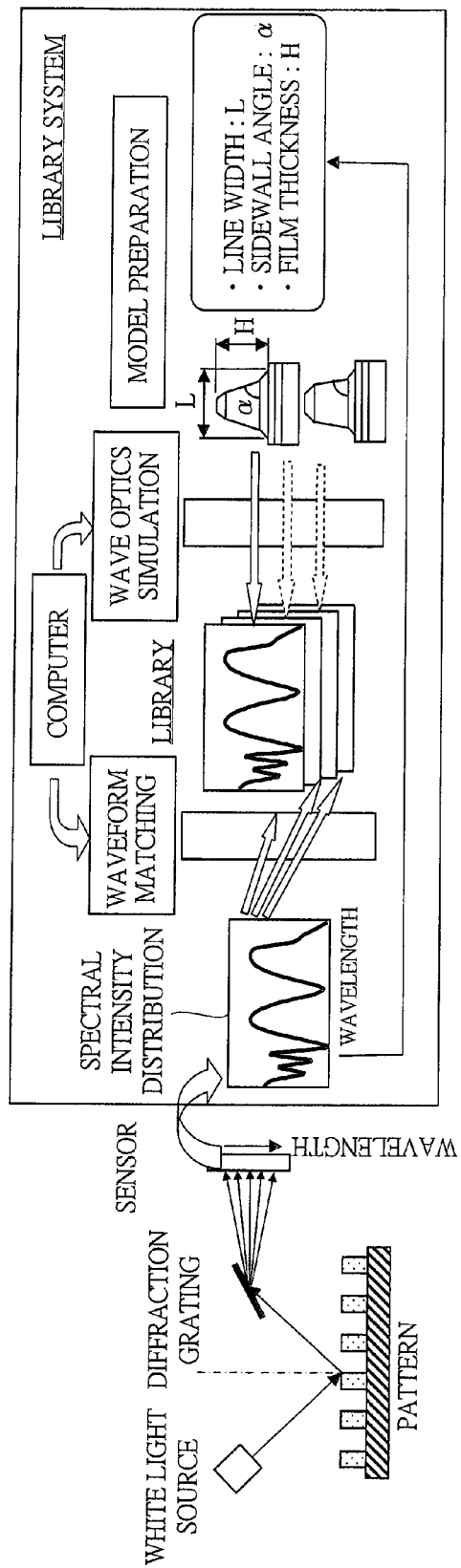
FIG. 4 is a diagram showing a measuring method of a pattern shape by using scatterometry in the outline of the one embodiment of the present invention.

FIG. 4 is a diagram showing a measuring method of the pattern shape by using scatterometry, and shows a measuring principle of the scatterometry which is one of the optical shape measuring devices.

A white light is made to be incident to a repetitive pattern region on the substrate wafer to detect a spectral intensity distribution (spectrum waveform) of its specular reflection light. And, matching is performed by wave optics simulation between a spectral waveform in a cross-sectional shape of a predetermined pattern and a spectral waveform actually measured to estimate a cross-sectional shape of the actual pattern. And, by utilizing the fact that the resist shape is changed depending on the exposure dose and the focus position, a wafer is prepared to which the exposure processing is performed with previously changing the exposure dose and the focus position in every exposure shot of the same wafer so that resist shapes in every set exposure dose and focus position are measured by the scatterometry. Next, a relation of the pattern shape change for the focus change is mathematized by using these measurement results so that there is provided a focus prediction equation having a cross-sectional-shape parameter of each of the resist patterns as an input value. In a focus measurement in mass production, a resist shape of a corresponding wafer is measured by using scatterometry, and a focus position thereof is measured by the focus prediction equation previously introduced.

Figure 5:
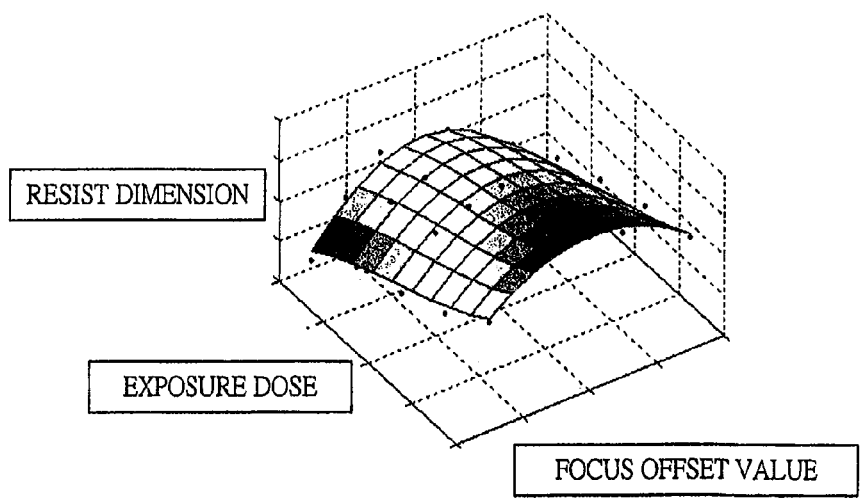
FIG. 5 is a diagram showing a relation among control parameters of the exposure device and a resist dimension in the outline of the one embodiment of the present invention.

FIG. 5 is a diagram showing a relation among the control parameters of the exposure device and the resist dimension, and shows a relation among "exposure dose" and "focus offset value" which are the control parameters of the exposure device, and the resist dimension.

In the dimension control of the resist pattern in the exposure device, the resist pattern shape depends on a number of parameters such as a resist type and film thickness thereof, illumination conditions of the exposure device (numerical aperture "NA" and illumination coherency "σ"), and developing conditions (temperature and time). However, since conditions of many parameters are determined at developing stage thereof, the parameters cannot be the control parameters of the resist shape at the mass production stage. At the mass production stage, for forming the resist shape (dimension and sidewall angle), a wafer is prepared to which the exposure processing is performed in every exposure shot of the same wafer with changing the exposure dose and the focus offset value to be input parameters of the exposure device, and the resist shape in each shot is measured, thereby determining the exposure dose and the focus offset value which lead to the predetermined resist shape. In general, as the measuring method of the resist shape, a scanning electron microscopy CD-SEM (Critical Dimension-Scanning Electron Microscopy) for irradiating electron beams from an upper surface of the resist pattern to measure the resist dimension from its secondary electron image is used. At the mass production stage, a shift amount from the target dimension using the resist dimension measured by CD-SEM is sequentially corrected by adjusting the exposure dose. An adjustment of the focus position at the exposure processing is performed by driving the wafer stage in a vertical direction of the projection lens depending on the change of the focus offset value.

As shown in FIG. 5, in the relation among the "exposure dose" and the "focus offset value" which are the control parameters of the exposure device, and the resist dimension, the resist dimension monotonously changes for the change of the exposure dose. This is because an energy amount irradiated to the resist film is changed by the change of the exposure dose. On the other hand, it is found that the resist dimension quadratically changes for the focus offset value putting a best focus position as a center. That is, since the resist dimension changes depending on the adjustment of the focus position, the resist dimension cannot be sufficiently matched with the target value in independently correcting the exposure dose and the focus offset value when the resist dimension and the focus position simultaneously change.

Hence, in the present embodiment, there are provided a manufacturing method and a manufacturing system of the semiconductor device of, in the exposure processing of the manufacture of the semiconductor device, measuring the resist dimension and the focus value (focus position) of the resist shape transferred to the wafer of the actual product and sequentially adjusting control parameters of the exposure device in order of the focus offset value and the exposure dose by using its measurement results for correcting the shifts of the resist dimension and the focus position in the exposure processing. In the following, contents of each embodiment will be specifically described.

<Manufacturing Method of Semiconductor Device>

Figure 1:
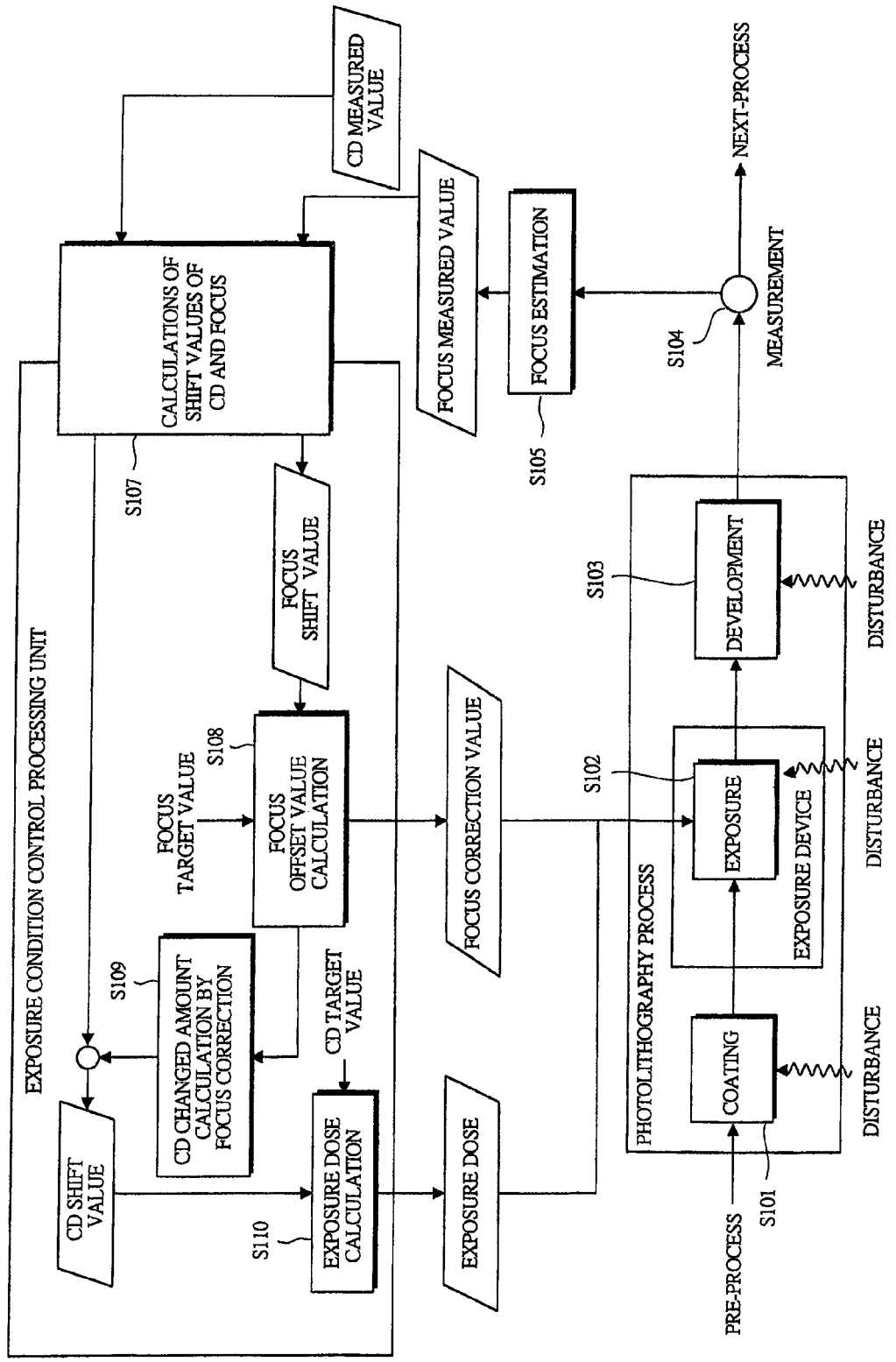
FIG. 1 is a flowchart showing a manufacturing method of a semiconductor device according to one embodiment of the present invention.

FIG. 1 is a flowchart showing a manufacturing method of a semiconductor device according to one embodiment of the present invention.

First, a process S101 for coating a resist film on a substrate wafer is performed. At this time, an antireflection film is often coated as a lower layer of the resist film. Next, an exposure processing S102 for transferring a circuit pattern written on a mask to a processing target wafer is performed in the exposure device. When the exposure processing S102 is performed, the following processes are performed in an exposure condition control processing unit, the processes of a process S107 for calculating shift values of a current resist dimension and a current focus position from a history of measurement results of a past resist dimension (also referred to as CD) and a past focus position, a process S108 for calculating a focus offset value by using the shift value of the focus position calculated at the S107, a process S109 for calculating the changed amount of the resist dimension by the focus offset value calculated at the S108, and a process S110 for calculating the exposure dose by using the shift value of the resist dimension calculated at the S107 and the changed amount of the resist dimension by the focus offset value calculated at the S109. And, in the exposure processing S102, the exposure processing to the corresponding wafer is performed by using the calculated exposure dose and focus offset value.

Next, a developing process S103 is performed so that the resist pattern is formed on the wafer. The formed resist pattern shape is measured in a shape measurement S104. An optical-system shape measuring device is used in the resist shape measurement. Further, with respect to the dimension of the resist pattern, not only the optical shape measuring device but also the measurement result of CD-SEM may be used. In a focus estimation process S105, the focus position in the exposure processing of the corresponding wafer of the S102 is calculated by using the measurement result of the resist pattern shape of the corresponding wafer measured at the S104. After that, the corresponding wafer is advanced to a next process.

Figure 6:
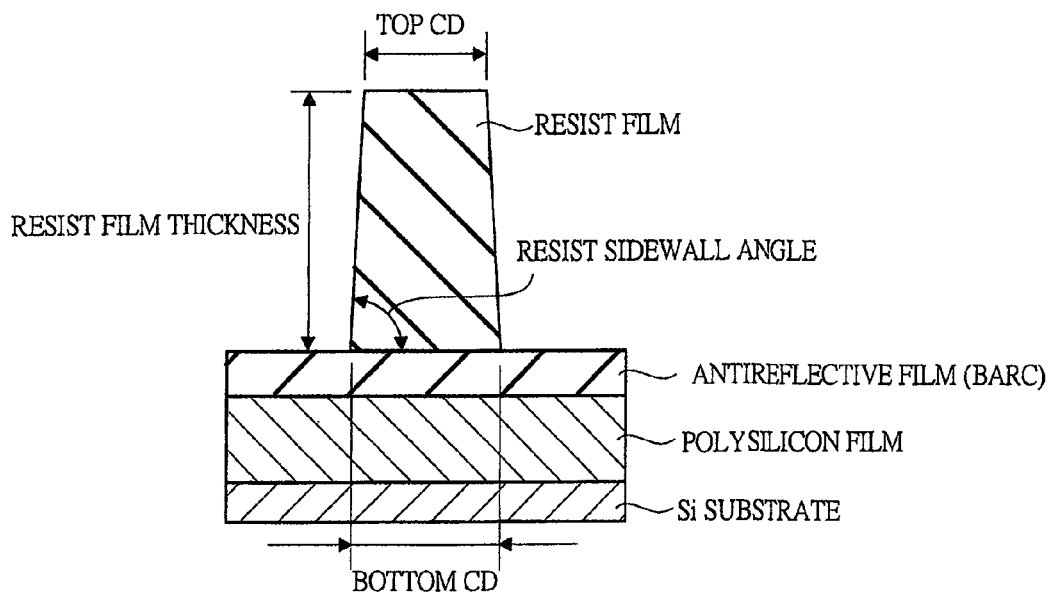
FIG. 6 is a diagram showing one example of a cross-sectional shape of the resist pattern in the exposure processing in the one embodiment of the present invention.

FIG. 6 is a diagram showing one example of a cross-sectional shape of the resist pattern in the exposure processing.

A film structure in the present case example has a configuration formed of a silicon (Si) substrate, a polysilicon film, an antireflection film, and a resist film which are disposed from bottom to top in this order. Depending on the type of the semiconductor device, there are cases where no antireflection film is used. The cross-sectional shape of the resist pattern is approximated to a trapezoidal shape. Parameters of the resist shape include a "top CD" which is a dimension of an upper portion of the trapezoidal, a "bottom CD" which is a dimension of a bottom portion of the trapezoidal, a "resist film thickness" which is a height of the trapezoid, and a "resist sidewall angle" which is an angle between a line connecting an upper side and a lower side of the trapezoid and the lower side. These parameters of the resist shape can be measured by the scatterometry which is the optical shape measuring device. The cross-sectional shape of the resist pattern may be separated into a plurality of trapezoidal shapes to be approximated.

Figure 7:
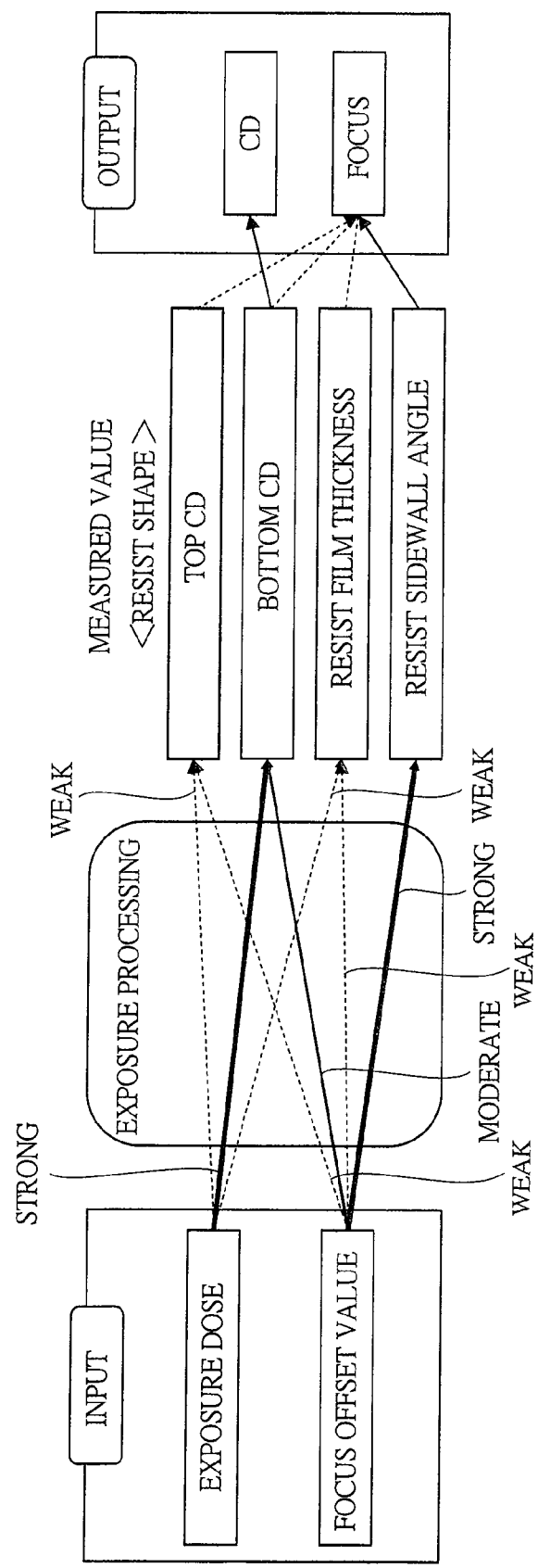
FIG. 7 is a diagram showing a relation between the control parameters of the exposure device and the resist shape and between the control parameters and a focus position at the exposure processing in the one embodiment of the present invention.

FIG. 7 is a diagram showing a relation between the control parameters of the exposure device and the resist shape and between the control parameters and the focus position at the exposure processing.

In the exposure processing, a relation such that the exposure dose and the focus offset value which are the control parameters of the exposure device are inputted and the CD and the focus are outputted is made to be a graph. The exposure processing is performed by changing the exposure dose and the focus offset value, and as a result of measuring the resist shape at that time, it is found to have a strong correlation between the exposure dose and the bottom CD and a weak correlation between the exposure dose and the top CD and between the exposure dose and the resist film thickness. On the other hand, it is found to have a strong correlation between the focus offset value and the resist sidewall angle and a moderate correlation between the focus offset value and the bottom CD and a weak correlation between the focus offset value and the top CD and between the focus offset value and the resist film thickness. Further, the focus position at the exposure processing is calculated from a polynomial with taking the top CD, the bottom CD, the resist film thickness, and the resist sidewall angle which are the resist shape parameters as variables.

In such a correlation, for setting the focus position to the best focus, the resist sidewall angle having the strong correlation with the focus offset value is changed when the focus offset value is changed. At the same time, although a sensitivity of the bottom CD is low compared to the resist sidewall angle, the bottom CD having the moderate correlation with the focus offset value is also changed. On the other hand, the change of the exposure dose mainly affects the bottom CD, and the resist sidewall angle is not changed by the change. In this case, the exposure dose and the focus offset value satisfying the target resist dimension and the target focus cannot be always uniquely determined, and is determined with a combination of a certain exposure dose and a certain focus offset value. Hence, in the present embodiment, paying attention to the relation in which the exposure dose affects only the bottom CD compared to the relation in which the offset value affects the resist sidewall angle and the bottom CD, such a two-stage control process is performed that, first, the focus offset value is calculated, and then, the calculation of the exposure dose considering a changed value of the CD by this focus offset value is performed as shown in FIG. 1.

Figure 8:
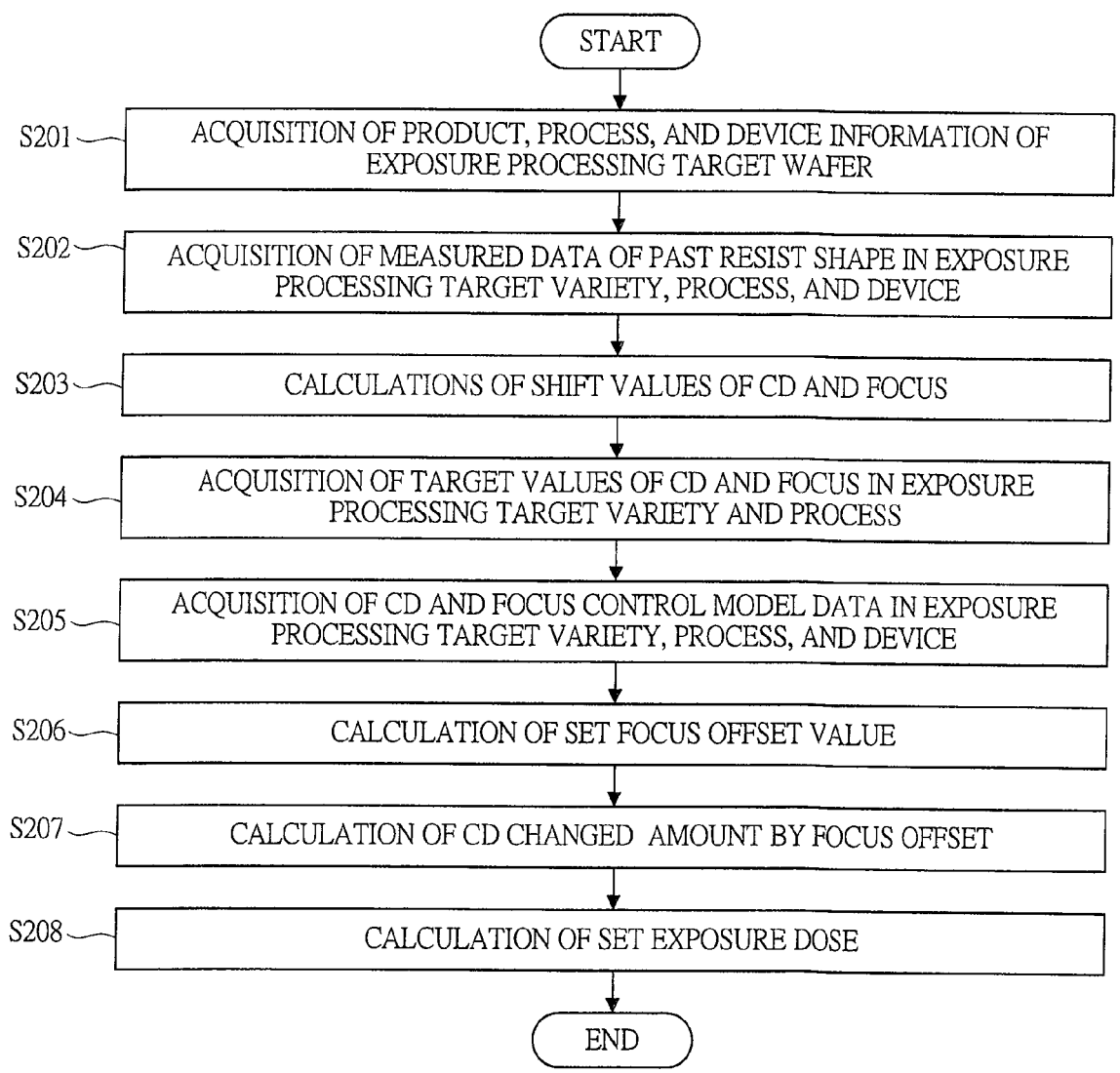
FIG. 8 is a flowchart showing a process flow in an exposure condition control processing unit in the one embodiment of the present invention.

FIG. 8 is a flowchart showing a processing flow in the exposure condition control processing unit of FIG. 1.

At a step S201, there are acquired a product (referred to also as type and variety), a process (referred to also as exposure processing), a device (referred to also as exposure device), and a mask number of the semiconductor device of the wafer to which the exposure processing is performed at this time. The information such as the product, the exposure process, the exposure device and the mask number can be acquired from a manufacturing management system for managing information of the entire manufacture of the semiconductor device based on a wafer number to which the exposure processing is performed.

At a step S202, there is acquired the past measurement result data in the product, the exposure process, the exposure device, and the mask number acquired at step S201. When only one exposure mask is available in the same product and the same exposure process, the mask number may be excluded from the acquired conditions of data. Further, when a manufacturing error of the exposure mask is sufficiently small, the mask number may be similarly excluded from the acquired conditions of the control model. The measured data includes a lot number, a wafer number, a cumulative processed number of the corresponding wafer, and measured values of a resist shape and a focus corresponding to the used mask number.

The resist shape includes the top CD, the bottom CD, the resist film thickness, the resist sidewall angle, and the like as shown in FIG. 6. Also, in the case of the resist shape shown in FIG. 6, the focus value is calculated by Equation (1). Each of the coefficients a1 to a5 is calculated by least-squares approximation of the result of the resist shape measured when the exposure dose and the focus are previously changed.

The focus value=$a1 \times$top CD+$a2 \times$bottom CD+$a3 \times$resist film thickness+$a4 \times$resist sidewall angle+$a5$ (1)

At a step S203, shift values of the resist dimension (CD) and the focus in the exposure processing of this time are calculated by using the measurement result data of past time acquired at the step S202. For continuous shifts of the resist dimension and the focus, a process of exponentially weighted moving-average and the like expressed by, for example, Equation (2) are performed, thereby calculating shift values of the resist dimension and the focus.

The shift estimation value of this time=$\lambda \times$adjacent measurement result+$(1-\lambda) \times$adjacent shift estimation value (2)

In addition, shift values of the resist dimension and the focus may be calculated by a process of simple moving average. Further, when the resist dimension or the focus shifts with time according to a sequence of continuous exposure processes in the same lot, shift values of the resist dimension and the focus are calculated by using only measurement result data corresponding to the process sequence of the wafer of this time to which the exposure processing is performed.

When shift values of the resist dimension and the focus in a process sequence in which the resist dimension and the focus are not measured are calculated, an approximate equation is prepared from transition of every process sequence actually performing the measurement to evaluate shift values of the resist dimension and the focus in the process sequence not performing the measurement. For example, in a case of polynomial approximation of fourth degree, when the process sequence number is denoted by X and shift values of the resist dimension and the focus are denoted by Y, the following equation is made.

$Y=a4 \times X^4+a3 \times X^3+a2 \times X^2+a1 \times X+a0$

The degree of the polynomial can be changed according to tendencies of shift values of the resist dimension and the focus in the lot.

At a step S204, there are acquired target values of the resist dimension and the focus corresponding to the product and the exposure process acquired at step S201.

At a step S205, there is acquired a control model of the resist dimension and the focus prepared previously corresponding to the product, the exposure process, the exposure device, and the mask number acquired at the step S201. When only one exposure mask is available in the same product and the same exposure process, the mask number may be excluded from the acquired condition of the control model. Further, when the manufacturing error of the exposure mask is sufficiently small, the mask number may be similarly excluded from the acquired condition of the control model. The control model of the focus is expressed by Equation (3).

The changed amount of the focus offset value=focus shift value−focus target value (3)

On the other hand, the resist dimension interdepends on the exposure dose and the focus offset value expressed by Equation (4) for the exposure dose and the focus offset value.

The resist dimension=$f$(exposure dose and focus offset value) (4)

The changed amount of the exposure dose=$f^{-1}$(resist shift value−target value and focus offset value) (5)

For example, a relation among the resist dimension, the exposure dose, and the focus offset value becomes a response curve surface model with a cubic term in the exposure dose and a quadratic term in the focus expressed by Equation (6).

[Formula 1]

$$\text{Resist Dimension} = \sum_{l=1}^{2} \sum_{m=1}^{3} b_{lm} x^l y^m \quad (6)$$

Here, x denotes the focus offset value, and y denotes the exposure dose. Each of coefficients $b_{11}$ to $b_{23}$ (in $b_{lm}$, l=1 to 2 and m=1 to 3) can be calculated by least-squares approximation of the measurement results of the resist dimension in the wafer to which the exposure processing is performed with previously changing the exposure dose and the focus.

At a step S206, by the target value of the focus of the exposure processing target wafer acquired at the step S204 and the equation of the control model of the focus acquired at the step S205, the focus offset value for setting the exposure processing target wafer is calculated.

At a step S207, a changed amount of the resist dimension by the focus offset value calculated at the step S206 is calculated by using Equation (4). When the relation among the resist dimension, the exposure dose, and the focus offset value is taken as the response curve surface model with a cubic term in the exposure dose and a quadratic term in the focus expressed by Equation (6), the changed amount of the resist dimension by the focus adjustment is expressed by Equation (7).

[Formula 2]

The resist dimension after the focus adjustment =

$$\sum_{l=1}^{2}\sum_{m=1}^{3} b_{lm}(x+\Delta x)^l y^m \quad (7)$$

The resist dimension before the focus adjustment = $\sum_{l=1}^{2}\sum_{m=1}^{3} b_{lm} x^l y^m$ The changed amount of the resist dimension by the focus adjustment = the resist dimension after the focus adjustment − the resist dimension before the focus adjustment Here, x denotes the focus offset value before the adjustment, Δx denotes the changed amount of the focus offset value, and y denotes the exposure dose.

At a step S208, the exposure dose for setting the exposure processing target wafer is calculated by using the target value of the resist dimension of the exposure processing target wafer acquired at the step S204, the equation of the control model of the resist dimension acquired at the step S205, and the changed amount of the resist dimension by the focus adjustment calculated at the step S207.

<Manufacturing System of Semiconductor Device>

Figure 9:
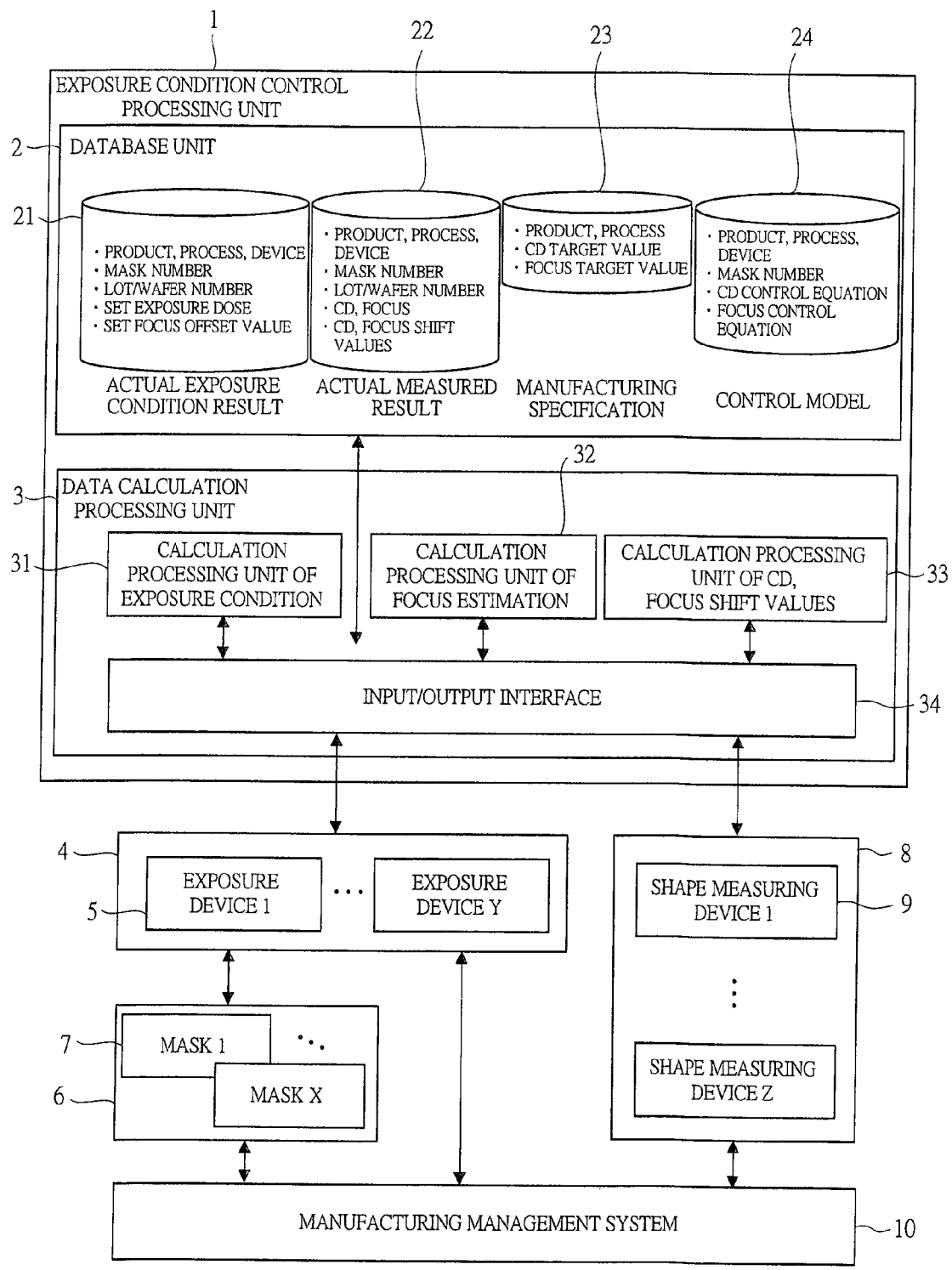
FIG. 9 is a block diagram showing an entire configuration of a manufacturing system of the semiconductor device according to a first embodiment of the present invention.

FIG. 9 is a block diagram showing an entire configuration of a manufacturing system of a semiconductor device according to a first embodiment of the present invention.

In FIG. 9, the manufacturing system of the semiconductor device is configured with an exposure condition control processing unit 1 including a database unit 2 and a data calculation processing unit 3, an exposure device group 4 including a plurality (1 to Y) of exposure devices 5, a mask group 6 including a plurality (1 to X) of masks 7, a shape measuring device group 8 including a plurality (1 to Z) of shape measuring devices 9, a manufacturing management system 10, and the like.

The exposure device group 4 is configured with at least one or more exposure devices 5. Note that each exposure device 5 is a device having a projection optical system for performing a pattern transfer. The exposure device group 4 is connected to the exposure condition control processing unit 1 including the data calculation processing unit 3 and the database unit 2. Further, the exposure device group 4 is connected to the manufacturing management system 10 for managing an entire manufacturing line of the semiconductor device. Note that it is possible to input the type (product), the process, the exposure device, the mask number, the lot number, and the wafer number of the semiconductor device of the exposure processing target wafer by, for example, reading a product number formed on the wafer, and then, to transmit them from the manufacturing management system 10 through a network.

The mask group 6 is configured with at least one or more masks 7, and is connected to the exposure device group 4 and the manufacturing management system 10. It is possible to acquire the type (product) of the semiconductor device and the mask used in the exposure process by, for example, reading the numbers formed on the mask from the manufacturing management system 10 through the network. Further, there is a possibility that a plurality of reticles exist in the same product and the same exposure process.

The shape measuring device group 8 is configured with at least one or more shape measuring devices 9, and is connected to the exposure condition control processing unit 1 and the manufacturing management system 10.

The database unit 2 is configured with: an exposure condition actual-result database 21 for storing the set exposure dose and the set focus offset value corresponding to the type (product), the exposure process, the exposure device, the mask number, and the lot/wafer number of the semiconductor device; an actual-measurement result database 22 for storing the measured data (for example, the resist dimension, the focus, and the like) corresponding to the product, the process, the manufacturing device, the mask number, and the lot/wafer number; a manufacturing specification database 23 for registering specifications of the semiconductor device (for example, target values of the resist dimension, the focus, and the like) corresponding to the product and the process; and a control model database 24 for registering the control model equation of the resist dimension and the focus corresponding to the product, the process, the exposure device, and the mask number.

The data calculation processing unit 3 is configured with an exposure-condition calculation processing unit 31, a focus-estimation calculation processing unit 32, a calculation processing unit for shift values of resist dimension (CD) and focus 33, and an input/output interface 34.

The focus estimation calculation processing unit 32 calculates a focus from measured data of the resist shape when the measured data is collected through the input/output interface 34, and registers the focus in the database unit 2.

The calculation processing unit for shift values of the resist dimension and the focus 33 calculates shift values of the resist dimension and the focus of the exposure processing target wafer at this time based on the data acquired at the database unit 2, and registers them in the database unit 2.

The exposure condition calculation processing unit 31 calculates set values of the exposure dose and the focus offset value of the exposure processing target wafer of this time by using shift values of current resist dimension and current focus acquired at the database 2, and transmits its calculation result to the exposure device group 4 through the input/output interface 34.

The manufacturing management system 10 performs a storage, a management of the manufacturing flow, a manufacturing instruction for a next process of the manufacturing results (the lot/wafer number, a manufacturing device name, a work starting and finishing date and time, and the like) in each process of the manufacture of the semiconductor device, and the like.

Figure 10:
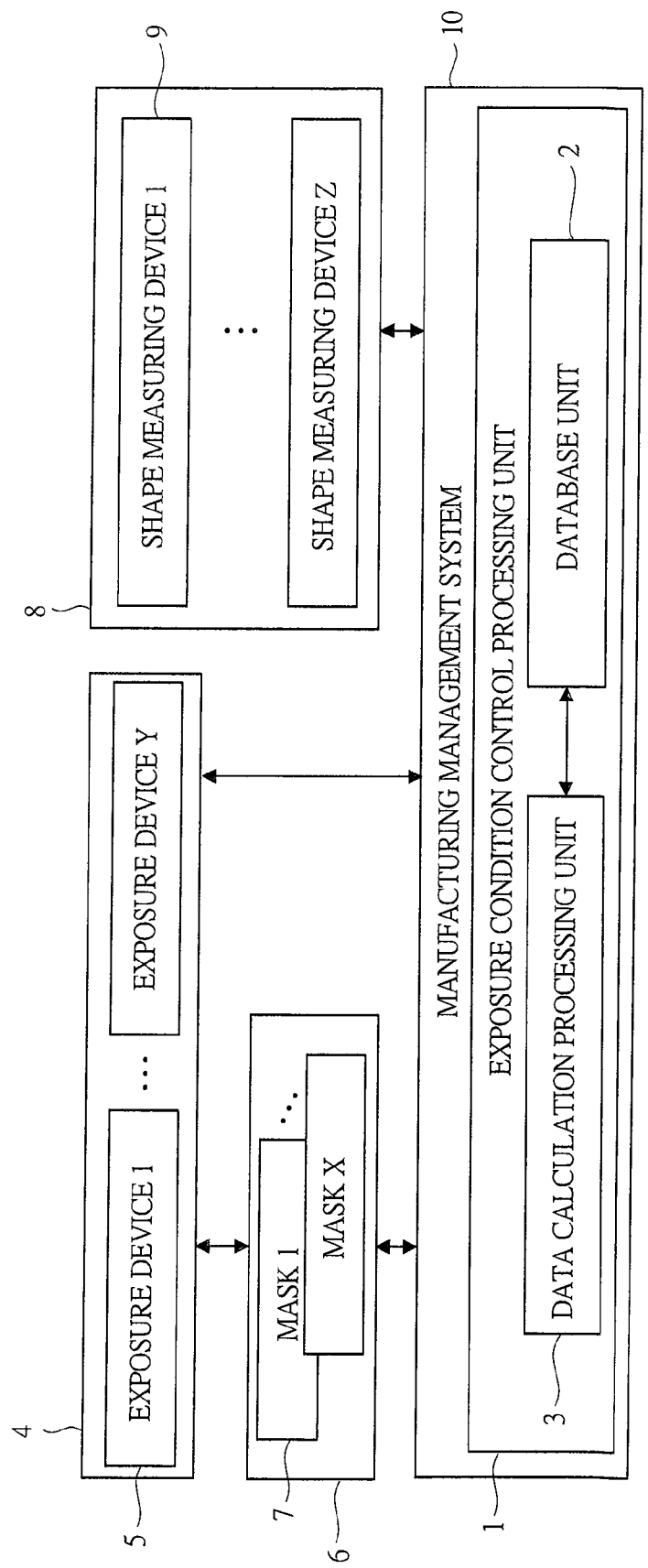
FIG. 10 is a block diagram showing an entire configuration of a manufacturing system of the semiconductor device according to a second embodiment of the present invention.

FIG. 10 is a block diagram showing an entire configuration of a manufacturing system of a semiconductor device according to a second embodiment of the present invention. Note that same reference numbers are attached to parts equivalent to those of FIG. 9.

In the second embodiment, an exposure condition control processing unit 1 configured with a database unit 2 and a data calculation processing unit 3 is incorporated into a manufacturing management system 10, and each process is performed in the manufacturing management system 10.

Figure 11:
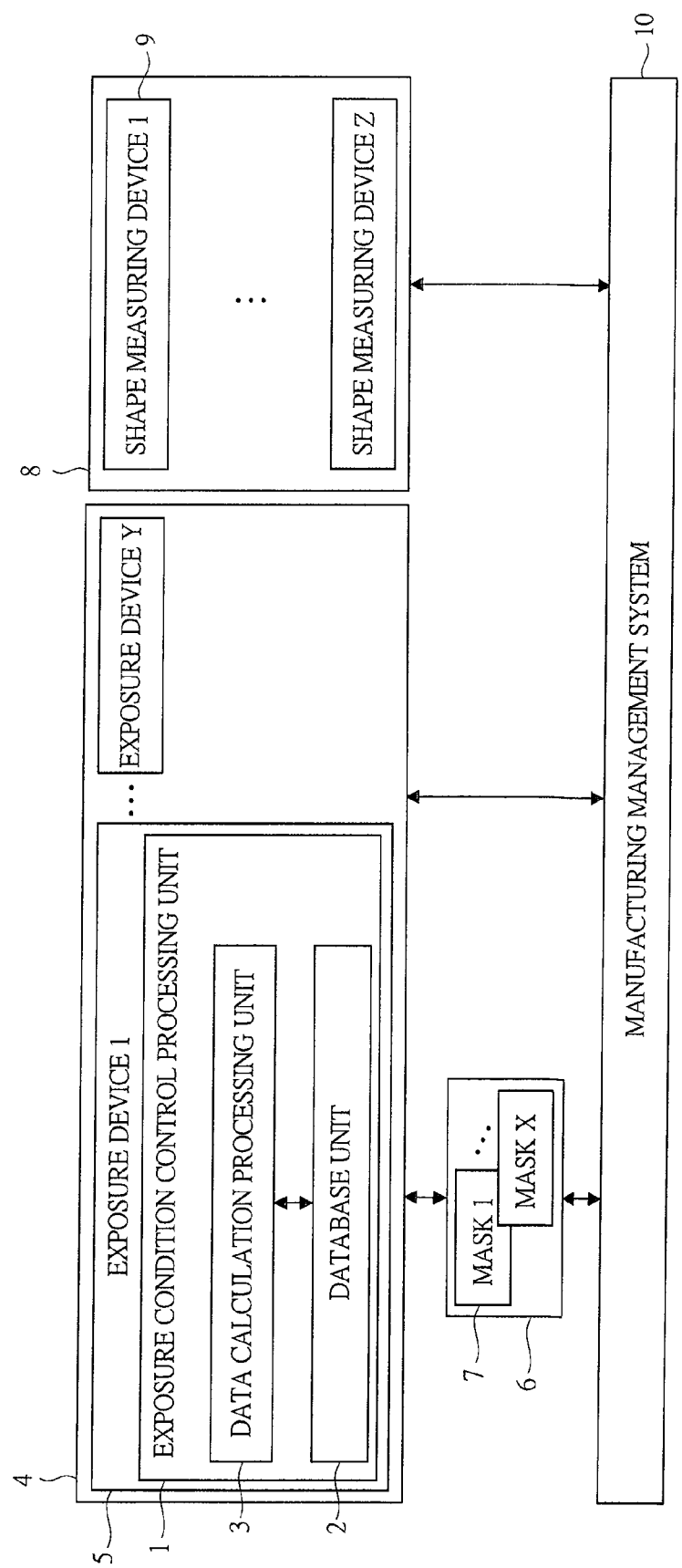
FIG. 11 is a block diagram showing an entire configuration of a manufacturing system of the semiconductor device according to a third embodiment of the present invention.

FIG. 11 is a block diagram showing an entire configuration of a manufacturing system of a semiconductor device according to a third embodiment of the present invention. Note that same reference numbers are attached to parts equivalent to those of FIG. 9.

In the third embodiment, an exposure condition control processing unit 1 configured with a database unit 2 and a data calculation processing unit 3 is incorporated into each of the exposure devices 5, and each process is performed in each of the exposure devices 5.

Figure 12:
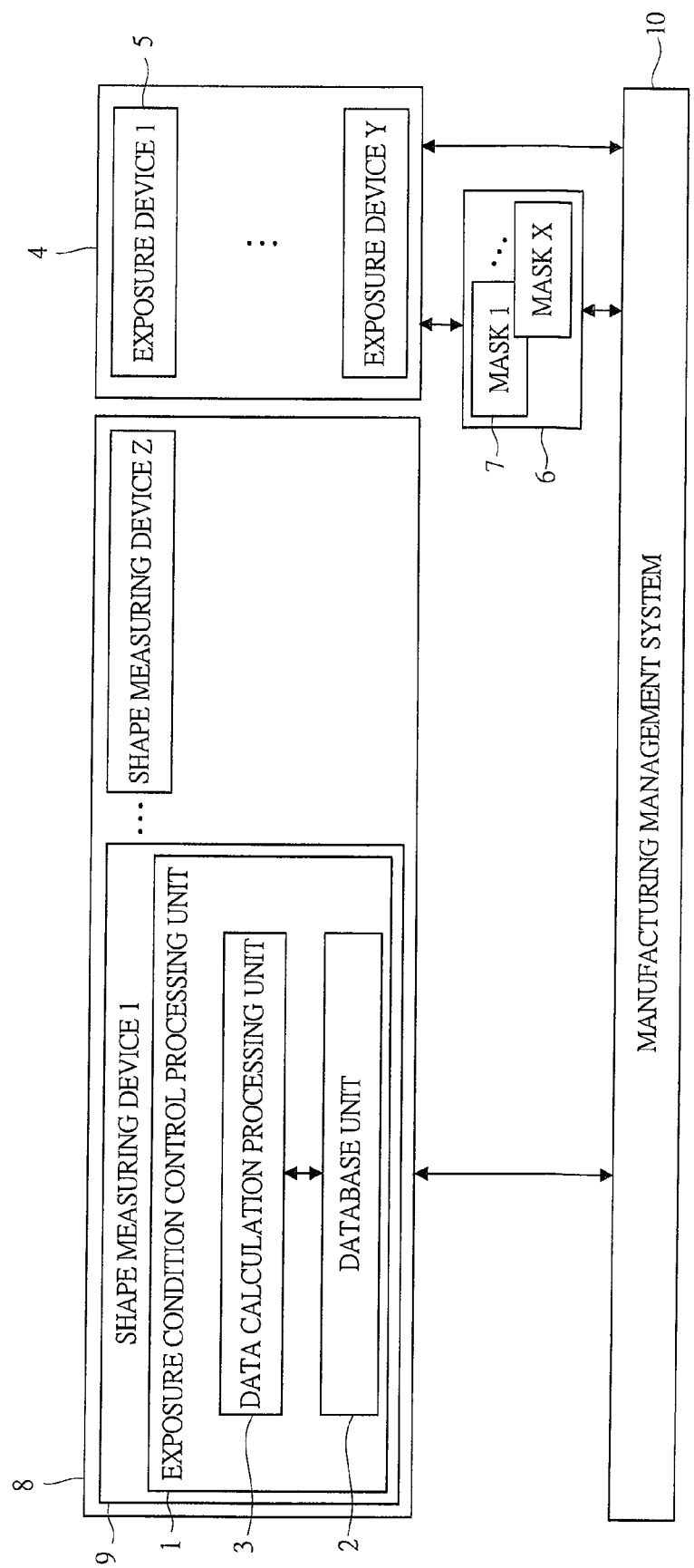
FIG. 12 is a block diagram showing an entire configuration of a manufacturing system of the semiconductor device according to a fourth embodiment of the present invention.

FIG. 12 is a block diagram showing an entire configuration of a manufacturing system of a semiconductor device according to a fourth embodiment of the present invention. Note that same reference numbers are attached to parts equivalent to those of FIG. 9.

In the fourth embodiment, an exposure condition control processing unit 1 configured with a database unit 2 and a data calculation processing unit 3 is incorporated into each of the shape measuring devices 9, and each process is performed in each of the shape measuring devices 9.

FIG. 13 is a diagram showing one example of an output screen performing an instruction of exposure conditions at the exposure processing S102 of FIG. 1.

The output screen displays the set the exposure dose and the set focus offset value in the type (product name) of the semiconductor device to which the exposure processing is performed, the exposure process, the exposure device, the mask number, and the lot number and the wafer number of the exposure processing target wafer. Note that the output screen is outputted to any of the exposure devices 5, an output terminal of the manufacturing management system 10, and an exclusive output terminal. Also, an output result is transmitted to a program for controlling the exposure processing inside the exposure device 5 to perform the exposure processing corresponding to the output screen.

<Manufacturing System of Semiconductor Device and Effect of Manufacturing Method Thereof>

FIG. 14A and FIG. 14B are diagrams each showing the control result of the exposure dose and the focus offset value at the time of the focus shift caused by using the manufacturing system of the semiconductor device according to each of the embodiments of the present invention and the manufacturing method thereof. FIG. 14A shows the change of the resist dimension for the focus shift value, and FIG. 14B shows the change of the resist sidewall angle for the focus shift value. Further, a diamond mark in the figures indicates the measurement results of the resist shape when the control is not performed. A cross mark indicates the control result by using each of the embodiments of the present invention. Further, for comparison, a triangular mark indicates the control result when the exposure dose and the focus are independently controlled.

As shown in FIG. 14A, the resist dimension changes in the vicinity of the target value thereof in each of the embodiments of the present invention compared to the case where the control is not performed for the change of the focus shift value and the case where the exposure dose and the focus are independently controlled. As shown in FIG. 14B, the resist sidewall angle also changes more in the vicinity of the target value thereof in each of the embodiments of the present invention for the change of the focus shift value. Thereby, it is recognized that controllability of the resist dimension and the resist sidewall angle for the focus shift value is most excellent in each of the embodiments of the present invention.

Figure 15:
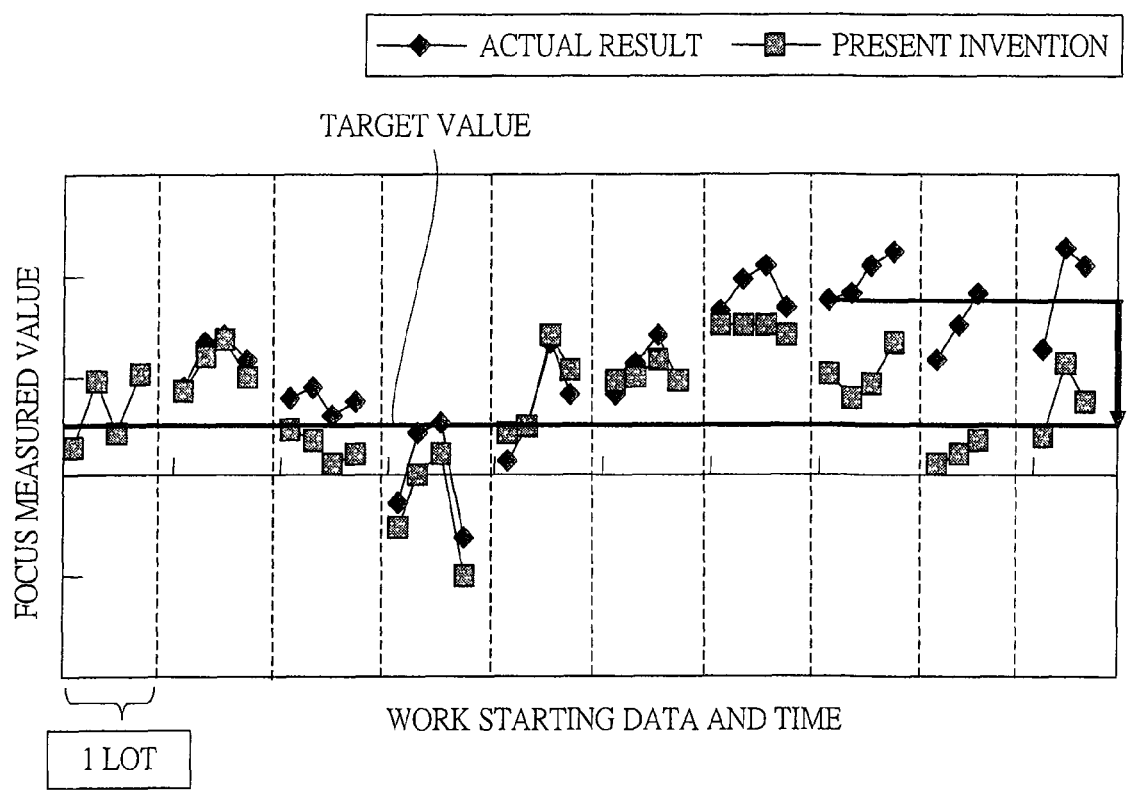
FIG. 15 is a diagram showing a control result of the long-term focus shift in each of the embodiments of the present invention.

FIG. 15 is a diagram showing the control result of a long-term focus shift using the manufacturing system of the semiconductor device according to each of the embodiments of the present invention and the manufacturing method thereof. In FIG. 15, consecutive three to four data correspond to one lot, and a change of the measured value of the focus for the work starting date and time is shown. A diamond mark indicates the measurement results of the focus in the case where the control is not performed.

A square mark indicates a measurement result using each of the embodiments of the present invention.

As shown in FIG. 15, the long-term focus shifts among the different lots and within the same lot are controlled so as to approach the target value by the control method of each of the embodiments of the present invention.

As described above, according to the manufacturing system of the semiconductor device according to each of the embodiments of the present invention and the manufacturing method thereof, in the exposure processing of the manufacture of the semiconductor device, shift values of the resist dimension and the focus position in the exposure processing of this time are calculated by using the measurement history of the past dimension of the resist pattern and the past focus position at the exposure processing, and the control parameters of the exposure device in order of the focus offset value and the exposure dose are sequentially adjusted so as to correct shift values of the resist dimension and the focus position, so that the exposure processing is performed, thereby being capable of reducing variations of the dimension of resist and the shape thereof caused by the exposure processing shift without previously performing the inspection work. As a result, the operation performance of the semiconductor device can be improved, and moreover, the operating rate of the exposure device can be improved.

In the foregoing, the invention made by the inventors of the present invention has been concretely described based on the embodiments. However, it is needless to say that the present invention is not limited to the foregoing embodiments and various modifications and alterations can be made within the scope of the present invention.

The manufacturing technique of the semiconductor device of the present invention can be used particularly for a manufacturing method having an exposure process for forming a circuit pattern on the semiconductor device and a manufacturing system thereof.

What is claimed is:

1. A manufacturing method of a semiconductor device comprising an exposure process for forming a predetermined circuit pattern of a semiconductor device on a semiconductor wafer, wherein
the exposure process includes:
a first process for measuring past resist dimensions of a resist pattern formed on a first semiconductor wafer and a focus position at an exposure processing;
a second process for estimating resist dimensions and a focus position of a second semiconductor wafer to which the exposure process will be performed next by using measurement results of the resist dimension and the focus position measured in the first process;
after calculating a focus offset value of the second semiconductor wafer, a third process for calculating an exposure dose of the second semiconductor wafer with considering this focus offset value by using estimation values of the resist dimensions and the focus position estimated in the second process; and
a fourth process for forming a resist pattern on the second semiconductor wafer by using the exposure dose and the focus offset value calculated in the third process.

2. The manufacturing method of a semiconductor device according to claim 1, wherein,
in the third process, the focus offset value is calculated so that a focus shift value of the second semiconductor wafer calculated by using the measurement result of the focus position of the first semiconductor wafer becomes a target value, and the exposure dose of the second semiconductor wafer is calculated by using measurement results of changed amounts of the resist dimensions calculated by this calculated focus offset value and the focus position of the first semiconductor wafer.

3. The manufacturing method of a semiconductor device according to claim 1, wherein
the third process includes the steps of:
(1) acquiring the measurement results of the resist dimensions and the focus position of the first semiconductor wafer corresponding to a type, a process, and an exposure device of the semiconductor device on the second semiconductor wafer;
(2) calculating shift values of the resist dimensions and the focus position of the second semiconductor wafer by using the measurement result acquired in the step (1);
(3) acquiring the target value of the resist dimensions and the focus position corresponding to the type and the process of the semiconductor device on the second semiconductor wafer;
(4) acquiring a control model equation of the resist dimension and the focus position corresponding to the type, the process, and the exposure device of the semiconductor device on the second semiconductor wafer;
(5) calculating the focus offset value of the second semiconductor wafer by using the focus shift value of the second semiconductor wafer calculated in the step (2), the target value acquired in the step (3), and the control model equation acquired in the step (4);
(6) calculating a changed values of the resist dimensions by the focus offset value calculated in the step (5); and
(7) calculating the exposure dose of the second semiconductor wafer by using shift values of the resist dimensions and the focus position of the second semiconductor wafer calculated in the step (2), the changed values of the resist dimensions calculated in the step (6), the target value acquired in the step (3), and the control model equation acquired in the step (4), and wherein
the step (1) to the step (7) are sequentially performed.

4. The manufacturing method of a semiconductor device according to claim 1, wherein,
in the third process, calculations of the exposure dose and the focus offset value of the second semiconductor wafer are performed by using a control model equation of the focus position with taking the focus offset value as its control parameter of the focus position and a control model equation of the exposure dose with taking the exposure dose and the focus offset value as its control parameters of the resist dimensions.

5. The manufacturing method of a semiconductor device according to claim 1, wherein,
in the third process, by using a tendency equation corresponding to a work starting sequence of an exposure device previously set based on information of a work starting sequence of the second semiconductor wafer, shift values of the resist dimensions and the focus position of the second semiconductor wafer in the calculations of the exposure dose and the focus offset value of the second semiconductor wafer are calculated.

* * * * *